United States Patent [19]

Parkansky et al.

[11] Patent Number: 5,514,229
[45] Date of Patent: May 7, 1996

[54] METHOD OF PRODUCING TRANSPARENT AND OTHER ELECTRICALLY CONDUCTIVE MATERIALS

[75] Inventors: Naum Parkansky, Raanana; Amir Ben-Shalom, Tel Aviv; Raymond L. Boxman, Herzliya; Larisa Kaplan, Rosh-Ha-Ain; Samuel Goldsmith, Herzliya; Hanan Yaloz, Ramat-Gan; Menachem Nathan, Tel Aviv, all of Israel

[73] Assignee: RAMOT-University Authorityfor Applied Research and Industrial Development Ltd., Tel Aviv University, Tel Aviv, Israel

[21] Appl. No.: 158,427

[22] Filed: Nov. 24, 1993

[51] Int. Cl.⁶ ................ C22F 3/00; C22F 3/02; C23C 4/06
[52] U.S. Cl. ............ 148/566; 427/453; 427/457; 427/458; 427/580
[58] Field of Search ............ 148/566; 427/453, 427/457, 458, 580

[56] References Cited

U.S. PATENT DOCUMENTS

| 400,366 | 3/1889 | Sedgwick | 148/566 |
|---|---|---|---|
| 1,683,209 | 9/1928 | Ruben | 148/566 |
| 1,966,496 | 7/1934 | Fruth | 148/566 |
| 2,349,767 | 5/1944 | Solakian et al. | 148/566 |
| 2,395,195 | 2/1946 | Roberds | 266/129 |
| 3,360,630 | 12/1967 | Blaszkowski | 219/76.13 |
| 3,463,667 | 8/1969 | Chopra | 427/457 |
| 3,756,847 | 9/1973 | Leibowitz et al. | 427/458 |
| 3,904,782 | 9/1975 | Pomerantz | 427/457 |
| 3,986,898 | 10/1976 | Oshida | 148/566 |
| 4,215,259 | 7/1980 | Rudd et al. | 148/566 |
| 4,277,517 | 7/1981 | Smith, Jr. | 437/181 |
| 4,358,478 | 11/1982 | Fuse et al. | 437/181 |
| 4,962,727 | 10/1990 | Harada | 427/458 |
| 4,987,005 | 1/1991 | Suzuki et al. | 427/580 |
| 4,987,437 | 4/1991 | Nath | 437/181 |
| 5,073,209 | 12/1991 | Giancola | 148/688 |
| 5,073,212 | 12/1991 | Frohlich | 148/566 |
| 5,080,726 | 1/1992 | McKannan et al. | 148/566 |
| 5,103,766 | 4/1992 | Yoshikawa et al. | 427/580 |
| 5,215,789 | 6/1993 | Kugan | 427/458 |
| 5,250,326 | 10/1993 | Drummond et al. | 427/458 |

FOREIGN PATENT DOCUMENTS 0009974   1/1983   Japan ................ 148/566

Primary Examiner—Upendra Roy
Attorney, Agent, or Firm—Reising, Ethington, Barnard, and Perry

[57] ABSTRACT

The present invention pertains to a method of controlling the microstructure and service properties of electrically conductive transparent and other materials by passing an electrical current through the materials while simultaneously employing an additional process. Examples of the additional process include heating, sintering, deposition, casting, electrical arcing, and immersion in liquids. In one embodiment of the present invention, the additional process is deposition of a transparent conductive coating material while passing a current through the deposited coating along the surface of the coated material.

13 Claims, 11 Drawing Sheets

METHOD OF PRODUCING TRANSPARENT AND OTHER ELECTRICALLY CONDUCTIVE MATERIALS

TECHNICAL FIELD

The present invention relates to material processing and, more particularly, to producing transparent conductive coatings with assistance of a surface current.

BACKGROUND OF THE INVENTION

It is known that diverse methods are employed for controlling the microstructure and service properties of materials, particularly of metals and metal alloys. Some of the methods include heat treatments, such as annealing and quenching, various mechanical operations involving plastic deformation, such as cold working and shot peening, and combination methods such as hot working.

The use of an electric current flow in conjunction with some of the above methods is known, primarily as a means of effecting workpiece heating. For example, Ruben (U.S. Pat. No. 1,683,209) uses a current flow along a wire to heat it in the presence of a magnetic field to increase its conductivity. Oshida (U.S. Pat. No. 3,986,898) use an electric current to heat a workpiece in order to induce controlled internal oxidation and thus improve the high temperature performance of a material. The electric current can be applied directly to the workpiece as in the above examples, or to a working fluid surrounding the workpiece. Solokian (U.S. Pat. No. 2,349,767) uses a three-phase AC current to heat a salt bath used to harden high speed steel. In addition, Solokian uses a d.c. current to scavenge metal impurities from the salt bath when workpieces are not present. In some instances, it has been found advantageous to use high frequency alternating current flows, in contrast to the d.c. or low frequency a.c. described previously. By using high frequencies, especially in conjunction with short processing times, the current flow can be confined to the surface of the workpiece. Roberds (U.S. Pat. No. 2,395,195) uses high frequency current flow to harden either the outer or inner surface of hollow cylindrical objects. Rudd (U.S. Pat. No. 4,215,259) combines rapid high frequency current heating with natural conduction cooling to harden materials such as steel by quenching. Froehlich (U.S. Pat. No. 5,073,212) uses a pulsed heat source, which may either be a laser or a high frequency induced current, to harden the root of turbine blades through a martensitic transformation. In all of the examples cited above, the disclosures teach the use of an electrical current as a means of heating.

In other examples, electrical current in the form of an electrical discharge is used to modify the surface properties of materials and components. Fruth (U.S. Pat. No. 1,966,496) uses an electrical spark, arc, and corona discharges to harden the surface of non-ferrous metals. Blaskowski (U.S. Pat. No. 3,360,630) uses a spark discharge followed by mechanical burnishing to harden the surface of metals. These disclosures illustrate the electrical current is flowing essentially normally to the surface of the conductor, and furthermore the current is flowing from the conductor into a normally insulating medium at the point where modification of the material is taking place.

An early use of an electrical current in conjunction with quenching is described by Sedgwick (U.S. Pat. No. 400,366). An electric current is applied to the workpiece as it is plunged into the coolant bath. The formed gas bubble formation breaks up the clinging steam bubbles, and hence the heat transfer to the coolant is improved. In this case, the electrical current is flowing essentially normally to the surface of the conductor; and, furthermore, the current is flowing from the conductor into the surrounding liquid medium.

A very different use of electrical current for improving the properties of conducting materials has been described recently, in which the electric current itself, or its concurrent electric field, causes an advantageous alignment of the crystal structure of the material at high temperatures. Giancoloa (U.S. Pat. No. 5,073,209) heats a conducting material to a temperature such that physical rearrangement of the atoms is possible by applying an electrical current flow. The sample is then cooled while the electrical current is continued in order to obtain conducting materials with an improved conductivity and superconducting materials with a high critical temperature. McKannan et al. (U.S. Pat. No. 5,080,726), heats the central portion of superalloy while passing an electrical current along its length and then applies directional cooling to obtain materials with an ordered microstructure.

Furthermore, transparent electrically conductive coatings have been known for a variety of applications, including window heaters, electrodes for displays, light emitting devices, light detectors, photovoltaic solar cells, light triggered semiconducting devices, and invisible burglar alarms for display windows. The most popular transparent coatings are fabricated from certain metal oxides, in particular, indium oxide, tin oxide, and zinc oxide. Enhanced conductivity is often obtained with the addition of a doping material, i.e., tin, in the case of indium oxide; antimony, in the case of tin oxide; and aluminum, in the case of zinc oxide. While a variety of techniques exist to deposit these coatings, they can generally be divided into two groups. The first group contains high deposition rate techniques such as spray pyrolysis and chemical vapor deposition. The conductivity of the coatings produced by these techniques is generally slower than that obtainable by the second group. The second group includes sputtering, evaporation, and activated reactive evaporation. These techniques can produce high conductivity coatings, but the deposition rate is very low and the cost very high.

The vacuum arc technique to produce coatings has been known for some time. The technique is widely used for metallurgical coatings, especially for TiN coatings on cutting tools, which extend their service lifetime considerably. Optical coatings have been recently developed by using this technique. One difficulty with the vacuum arc is that the cathode spots produce a spray of liquid droplets, or macroparticles, of the cathode material. While some macroparticle inclusion can be tolerated in metallurgical applications, they can be extremely deleterious in optical and electronic applications.

In vacuum arcing, an electrical arc is sustained between two conductive electrodes in a chamber which is either evacuated or has a low pressure process gas. The arc tends to be constricted at minute areas of the cathode surface, known as cathode spots, which reach very high temperatures and produce copious quantities of vaporized cathode material, which becomes highly ionized by the action of the arc current passing through it. The resulting metal vapor plasma jet will produce a metal coating on surfaces on which it impinges in an evacuated chamber. If a reactive process gas is present, a compound of the cathode material and the process gas may be deposited.

It is known that macroparticle contamination can be virtually eliminated by passing the plasma beam through a curved duct with a magnetic field parallel to duct. The magnetic field bends the plasma beam so that it follows the curvature of the duct, while macroparticles are not affected by the magnetic field and collide with the walls of the duct, and, for the most part, adhere thereon. Vacuum arcing in conjunction with macroparticle filters have produced optical quality Al2O3 and TiO2 coatings.

The most popular transparent conductors, Indium (Tin) Oxide, and Tin (Antimony) Oxide, are based on low melting-point metals. Low melting-point metals are particularly prone to producing a prodigious amount of macroparticles. Furthermore, the materials are often difficult to obtain in forms suitable for fabricating a cathode. Also, some of the materials, such as Indium, are sufficiently expensive to justify efforts to fully utilize all the material. In addition to problems of cathode fabrication, process parameters must be optimized for good coating conductivity.

What is needed is a transparent conductive coating with reduced macroparticles and improved microstructure. What is also needed is a method to influence the microstructure that does not require high temperatures to process solid materials nor require the use of directional cooling when processing liquid materials. What is also needed is an economical way of producing transparent conductive coatings having a high conductivity at a fast deposition rate.

SUMMARY OF THE INVENTION

The present invention relates to a method of controlling the microstructure and service properties of electrically conductive materials by passing an electrical current through the material while simultaneously processing the material. The processing may include, as examples, heating the material, casting the material, depositing the material, subjecting the material to an electrical discharge, or immersing the material in a liquid. The process may be applied to the material prior to its employment in its service environment, or the process may occur as part of the service environment.

The present invention includes an apparatus for depositing transparent conducting coatings which in various embodiments includes the following elements: a vacuum deposition chamber, a cathode containing the metallic element or elements of the transparent conducting material, an anode, a macroparticle filter, preferably in the form of a quarter torus, and including the means for generating a magnetic field within the torus in a direction generally parallel to the toroidal axis, the means for evacuating the deposition chamber, the means for introducing and regulating the flow of process gas, and the means for holding the substrate upon which the coating is deposited.

In a preferred embodiment, the cathode is a cup shaped metallic receptacle filled with a lower melting point second metal, which is subsequently evaporated and deposited onto the substrate. In other preferred embodiments, the substrate holder is adapted for, or includes the means for, heating the substrate, applying a bias voltage to the substrate, or applying an electrical field or current flow parallel to the substrate surface.

The present invention also includes a method for depositing transparent conducting coatings, which includes preparing a cathode by melting or casting the metallic elements to be deposited into a cup shaped receptacle of a higher melting point material, placing the cathode within a vacuum chamber, igniting an electrical arc between said cathode and an anode which is also located within the vacuum chamber, feeding into the chamber a flow of a suitable process gas such as an oxygen containing gas, passing the plasma beam formed on the cathode surface through a macroparticle filter in order to remove macroparticles, and allowing the plasma beam, mixed with process gas, to deposit an oxide coating on a suitably located substrate.

In various preferred embodiments of this process, the gas flow is adjusted prior to arc ignition to its final value, and the resulting pressure in the chamber prevents deposition until the arc plasma pumps the chamber to a lower pressure, thus eliminating the deposition of an opaque metal coating at the beginning of the process. Preferably, the substrate is heated, either before deposition, or as a separate post-deposition stage. The substrate may be subjected to an electrical bias with respect to the adjacent plasma, or an electrical field or electrical current is imposed on the growing coating in a direction parallel to the substrate surface. In yet another preferred embodiment, the rate of growth of the electrical conductivity is used as a control signal to control a critical process parameter such as gas pressure, substrate temperature, or magnetic field, in order to maximize coating conductivity.

In accordance with another aspect of the invention, a transparent material includes a transparent substrate and a transparent conductive coating deposited on a surface of the substrate by a vacuum deposition process with an electrical current passing through the coating simultaneously as it is being deposited with the current running, generally parallel to the surface of the substrate.

BRIEF DESCRIPTION OF THE DRAWINGS

Reference now is made to the accompanying drawings in which.

DETAILED DESCRIPTION OF THE INVENTION

Figure 1:
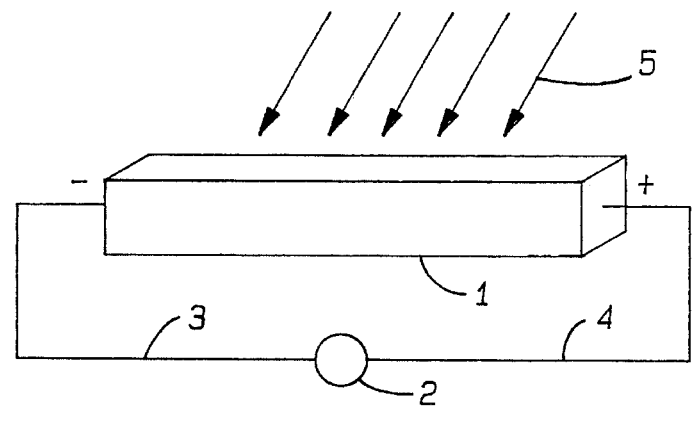
FIG. 1 is a schematic illustration in accordance with the invention.

In FIG. 1, the general method of the present invention is schematically illustrated. The material to be processed 1 is connected to a source of electrical current 2 by means of electrical conductors 3 and 4, while another process illustrated schematically as 5 is simultaneously applied.

In all of the drawings above, the material to be processed is subjected to an externally applied electrical current while it is being processed. An unexpected result occurs, namely, that the properties of the material, such as the microhardness, resistance to corrosion or erosion, surface roughness, or the electrical conductivity, are changed from what would normally occur in the process as a result of the application of the electrical current. X-ray diffraction analysis has revealed that these changes in properties are connected to a change in the microstructure (i.e., crystalline phase and orientation, and/or the presence of internal stress, and/or the presence of defects in the crystalline structure). It should be noted that this effect is often observed under conditions where the electrical current does not cause any substantial heating, i.e., the effect is caused by the flow of electrical current or its concurrent electrical field, and not by Joule heating. A possible mechanism of action is that in the presence of electrical current flow, material phases which more readily conduct current, and crystal orientations which more readily conduct current in the direction of the current flow, are thermodynamically favored. In other words, the presence of an electrical current extends the area of favorable phases and orientations in the phase diagram, making the fabrication of those phases favorable during processing. A further mechanism of action is that the presence of an electrical current encourages the propagation of defects in the crystalline structure in directions parallel to the current flow. A further mechanism of action is that the presence of an electrical current encourages crystal growth at the extremities of crystalline grains laying in the direction of the electrical current flow. These mechanisms of action are presented to explain the underlying science of the invention, but in no manner to limit the invention.

Figure 2:
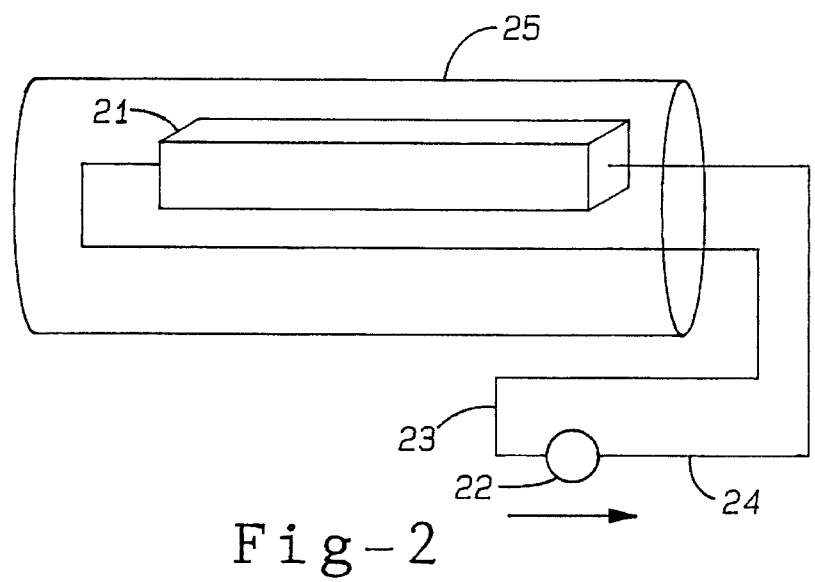
FIG. 2 is a schematic view illustrating one embodiment according to the invention.

A particular embodiment of the invention is illustrated in FIG. 2. The material to be processed 21 is connected to a source of electrical current 22 by means of electrical conductors 23,24 while it is located within an oven 25 which simultaneously heats the material.

In this embodiment, the process is heating in an oven and the material is copper. Whereas the prior art teaches that specifically the electrical conductivity can be modified if the sample is heated sufficiently so that the atoms are mobile, the present invention teaches that a variety of properties can be modified, even at relatively low temperatures. While no precise definition may be given for when atoms are mobile as there is some statistical probability than an atom may move for any finite temperature above zero, the rate at which this occurs is a rapidly increasing function of temperature; and, for relatively cool temperatures, the rate is insignificant. A common measure of the temperature at which the atoms are mobile is the recrystallization temperature, or the annealing temperature, which typically is approximately ⅔ of the melting temperature $T_m$ on an absolute temperature scale. In accordance with the present invention, modifications of the microstructure can occur at temperatures substantially below the annealing temperature if an appropriate electrical current is applied.

In one example, 5×8×80 mm copper bars were heated in an oven 25 having an air atmosphere to a temperature of 80° C. This is substantially below ⅔ $T_m$ for Cu. When the sample was so heated for 4 hours, without any current applied, a uniform microhardness of 103 kg-f/mm² was measured at the surface of the bar along its length. However, if a 20 amp current flowed in the direction of the long dimension of an identical bar during an identical heating cycle, the microhardness varied along the length of the bar as illustrated in FIG. 2, where one end of the bar is attached to the positive terminal of the current source, and the other end of the bar is attached to the negative terminal of the current source. X-ray diffraction studies indicated that the defect density, as measured by the width of reflection lines, were greater towards the end of the bar connected to the positive pole, in comparison with the defect density at the end connected to the negative pole.

Figure 3:
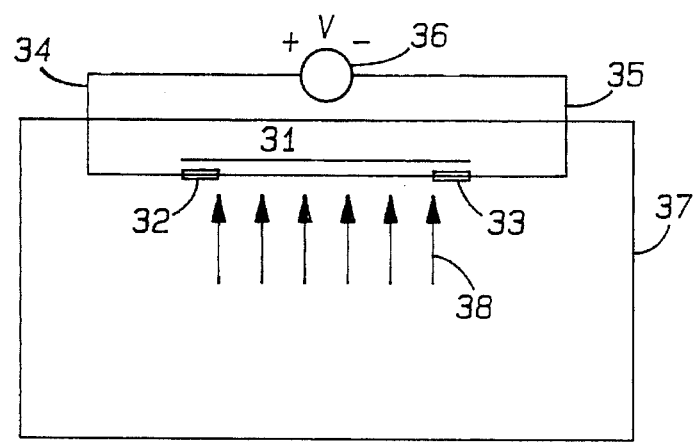
FIG. 3 is a schematic view illustrating a second embodiment of the invention.

Another embodiment of the invention is illustrated in FIG. 3. A substrate 31 is provided with two electrical contacts 32 and 33, and connected by means of conductors 34 and 35 to a source of electrical voltage 36. The substrate is located within a deposition chamber 37, in which a deposition process such as evaporation, vacuum arc deposition, sputtering, or chemical vapor deposition takes place, producing a vapor stream of the material illustrated schematically as 38.

In this embodiment, the process is deposition, and the material is $SnO_2$. This material, when properly deposited, is a transparent conductor. As an example, coatings of $SnO_2$ were prepared by vacuum arc deposition with the apparatus shown in FIGS. 11, 12, and 16.

Figure 11:
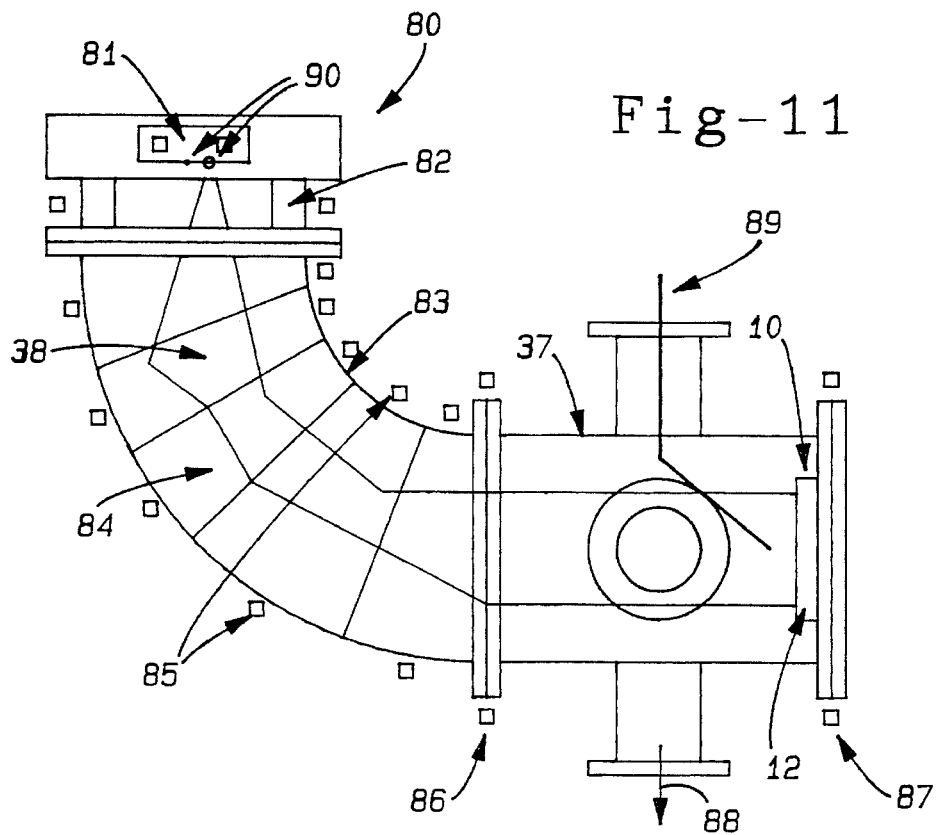
FIG. 11 is an overall schematic diagram of a filtered vacuum arc deposition apparatus that may be used with the method illustrated in FIG. 3.

An electrical arc is a high current, low voltage electrical discharge between two electrodes. The electrical current is generally conducted by a plasma including ions and electrons originating from the gaseous medium between the two electrodes. Electron emission is generally localized on the cathode surface in small regions thereon known as cathode spots. These spots are extremely hot and generally molten. For sufficiently low gas pressures, most of the interelectrode medium is vaporized cathode material produced at the cathode spots. Most of this metal vapor is ionized and forms a plasma jet containing energetic metal ions. Part of the metal vapor plasma flows back to the cathode surface and is believed to interact with the microscopic liquid metal pool of the cathode spot, and to be responsible for emission of liquid metal droplets. A coating will form on a substrate intercepting the cathodic plasma jet. Generally the coating includes a microscopically uniform layer formed by condensation from the plasma jet and local irregularities caused by the inclusion of liquid droplets which fuse upon contact with the surface, or pin holes, left by the impact of non-adhering droplets. Generally the presence of droplets is deleterious to the coating, especially in the case of optical coatings in which included droplets cause considerably optical scattering. The droplets are virtually eliminated by passing the plasma beam through a macroparticle filter assembly 80 as shown in FIG. 11, having a curved duct or pipe with a magnetic field generally parallel to the axis of the duct or pipe. The metal vapor plasma flows generally parallel to the wall, while metal droplets are virtually unaffected by magnetic fields, and travel in approximately straight lines until they strike a surface upon which they solidify and collect.

The major parts of an apparatus for filtered vacuum arc deposition are illustrated in FIG. 11. The cathode 81 and anode 82 are located at one end of the torroidal macroparticle filter housing 83. The macroparticle filter is equipped on the inside with baffle plates with a central opening 84 and with field coils 85. The macroparticle filter is connected to a vacuum deposition chamber 37, which also provides a connection 88 to the vacuum pumping system, a gas flow inlet 89, and the means for mounting the substrate 10 upon which the transparent coating 12 is deposited. The chamber 37 is also equipped with a pair of magnetic field coils 86 and 87. Means are provided (not shown in FIG. 11 for the scope of simplicity of the drawing) for igniting cathode spots on the surface of the cathode 81, for example, by use of an auxiliary trigger electrode at anode potential which makes momentary contact with the cathode, or a fixed trigger electrode in close vicinity to the cathode upon which a high voltage pulse is imposed. Once cathode spots 90 are ignited on the cathode surface, they produce a plasma jet 38 which is collimated and directed by the magnetic field onto the surface of the substrate 10. The plasma jet mixes with the process gas, particularly close to the substrate 10, and thus the deposition of the coating 12 includes both the material of the cathode surface, and the process gas.

In the prior art of vacuum arc deposition, where the metallic element of the coating typically has a reasonably high melting point, such as titanium with a melting temperature of 1943° K., the cathode is typically fabricated by machining operations, starting with a solid piece of the desired material. In the case of transparent conducting coatings, the typical metallic elements in the coating are tin (Sn) and indium (In), which have low melting points, 232° and 156° C., respectively. Furthermore, especially in the case of In, the metal is very soft, which poses difficulties in machining and maintaining the structural integrity of a cathode fabricated entirely of In.

Figure 12:
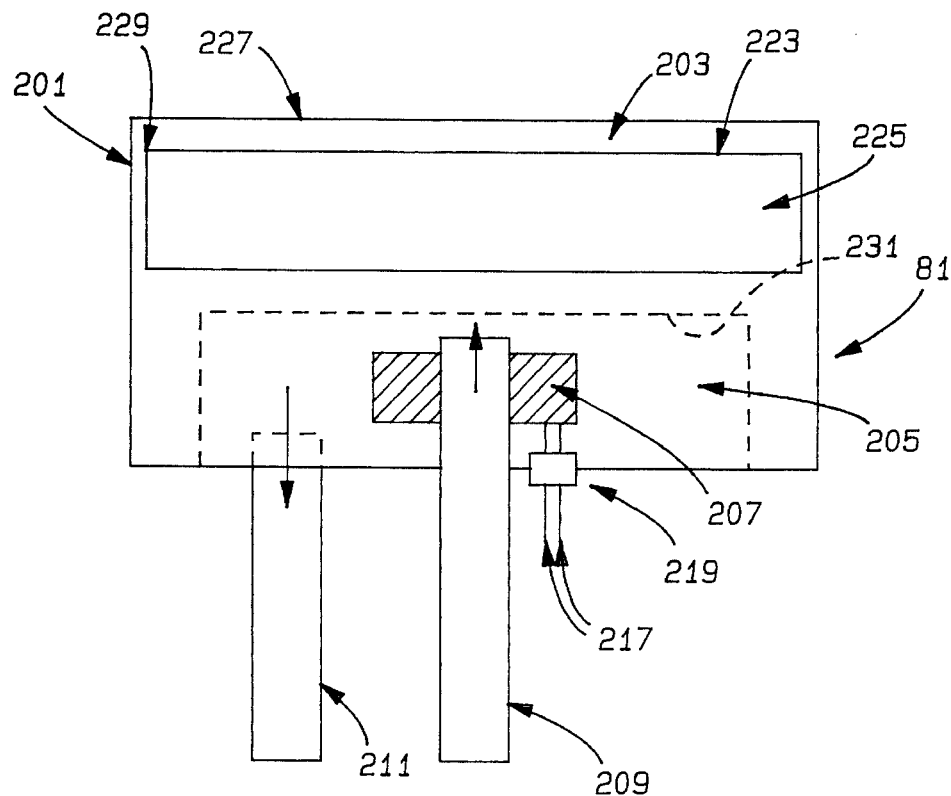
FIG. 12 is a detailed drawing of the cup like cathodes shown in FIG. 11.

In a preferred embodiment of the cathode 81 as illustrated in FIG. 12, a novel two-material cathode is utilized. A cup-like receptacle 201 is fabricated from a material having a reasonably high melting temperature. A preferred material is copper because of its high electrical and thermal conductivities. The metallic element of the coating can then be cast into the open cavity 203 of the cathode or, alternatively, solid pieces of the metallic element of the coating can be placed in cavity 203 and the entire assembly heated to a temperature exceeding the melting point of the metallic element of the coating. For example, if the coating material is a Sn—O compound, solid pieces of tin are placed in cavity 203, and the assembly is heated to a temperature exceeding 232° C. The metallic element melts and flows to form a body 225 with a smooth upper surface 223. The entire cathode can then be cooled and mounted in the vacuum system. The surface 223 will be the preferred location for cathode spots during the arc deposition process.

Preferably, the cathode is cooled during the arc process, for example, by water, by means of a cooling cavity 205 at the back surface 231 of the cathode. This is particularly important when evaporating low melting point materials such as Sn and In. If the bulk of the material 225 to be evaporated is molten, considerable material loss in the form of liquid droplets may occur during arcing. It is likewise preferable to provide the cathode with the means of producing a magnetic field with a radial component on the cathode surface, such as a field coil 207. Alternatively, the magnetic field can be produced by a permanent magnet. One skilled in the art will also recognize that the strength and direction of the magnetic field can be modified by placing high permeability materials such as iron in the vicinity of the coil. Electrical current is brought to the coil by means of wires 217 which pass through a feedthrough 219. The interaction of the cathode spot current with the radial magnetic field cause the cathode spots to move on the surface 223 of the soft source material 225 in cavity 203 in the retrograde direction, i.e., in the direction given by $-\vec{J} \times \vec{B}$, where $\vec{J}$ is a vector representing the electrical current density in the plasma, $\vec{B}$ is a vector representing the magnetic field. In the present case, the direction is in the azimuthal direction, i.e., the cathode spots rotate around the cathode. This tends to spread the heat load more evenly over the cathode surface, and thus prevents gross local melting, which would otherwise occur with a stationary cathode spot. Preferably the field coil 207 is located in the cooling cavity 205, and thus the coolant circulation can cool the field coil, as well as the cathode. Water, or another coolant fluid, is brought into the cooling cavity 205 by pipe 209 and removed by pipe 211, where the arrows indicate one preferred direction of coolant flow. In some embodiments, water is the preferred coolant liquid. In others, a liquid with a lower freezing point, such as nitrogen, may be preferred in order to maintain the cathode at a lower temperature, or to facilitate high heat loads without cathode melting, which would otherwise accompany higher currents needed for higher deposition rates. Depending on the exact mounting details of the cathode within the vacuum system, the cathode may also be provided with tapped holes for mounting and grooves for sealing o-rings (not shown on FIG. 12).

One skilled in the art of vacuum arcs might expect for the cathode spot to selectively locate itself at the interface 227 between the desired source material 225 and the rim of 201. If this occurred or if, in general, the arc spot located itself on the Cu base, then both contamination of the coating and a short lifetime for the cathode might be expected.

In practice, all of the interior cavity of 203 becomes coated with the material of 225, including a layer of material 225 placed on the exposed upper face 229 of rim 201, so even if the cathode spot temporarily locates itself there, the primary erosion product is the material 225. In general, the cathode spots tend to locate themselves fairly evenly on a statistical basis on the entire surface 223. In the course of time, the material 225 is expended, but the overall structure of 201 is maintained with little wear. Thus, long life is achieved by periodically refilling the cavity 203 with the desired material 225 of the coating material. This design and the refilling procedure are advantageous over the usual prior art in vacuum arcs in that the expense of refilling the cathode is much less than that of machining a new cathode.

The process of producing transparent conductive coatings using filtered vacuum arc deposition shown in FIG. 12 includes the following steps: A cathode 81 is prepared containing the metallic elements of the desired coating material. The cathode is mounted in an appropriate location in a vacuum chamber 37, and the substrate or substrates upon which the coating is desired are likewise mounted in the vacuum chamber 37 at the location suitable for it or them. The vacuum chamber is evacuated. Magnetic field coils are energized to an appropriate value. A flow of gas, including at least the gaseous element or elements of the desired coating material, is caused to flow into the chamber 37, and means are provided for ensuring that the flow rate will be appropriate for obtaining the desired amount of said gaseous element in the coating material. An arc is ignited between the cathode and the anode, which produces a plasma jet 38 containing vaporized and ionized metal atoms of the metallic elements of the coating material. The plasma is directed by the magnetic field through the macroparticle filter 80 which removes macroparticles, or liquid droplets, of the cathode material. The filtered plasma beam mixes with gas atoms so that metal and gas atoms arrive together at the substrate surface, upon which they condense and form a coating.

Desired coating materials known in the prior art, including tin oxide, tin(antimony) oxide, indium oxide, indium (tin) oxide, zinc oxide, and zinc(aluminum) oxide. The element in parenthesis is an alloying element, representing a small fraction of the total. In order to obtain an electrically conductive material, it is generally believed that a non-stoichiometric ratio of oxygen to metal atoms is required. The innovation of this invention is not in the selection of these materials, but rather in the method of producing coatings of these materials, and apparatus for implementing this method.

In prior art vacuum arc deposition of hard materials for tool coatings, often the arc is operated in vacuum in order to provide energetic metal ions for cleaning the substrate surface by sputtering, or even to deposit an intermediate metal layer which aids in adhesion. This procedure is not appropriate to the present application and, in fact, would be highly deleterious, in as much as even a thin metal layer would tend to be opaque and would thus decrease the light transmission through the coatings. In the preferred embodiments of the present invention, steps are taken to prevent the formation of a metal coating layer on the substrate. In one preferred embodiment, the current to the magnetic field coils of the macroparticle filter is set to zero or to a low level at the instant the arc is ignited. Then the gas flow rate is adjusted to ensure that only an appropriate oxide layer forms and, specifically, that no opaque metal layer forms.

Figure 13:
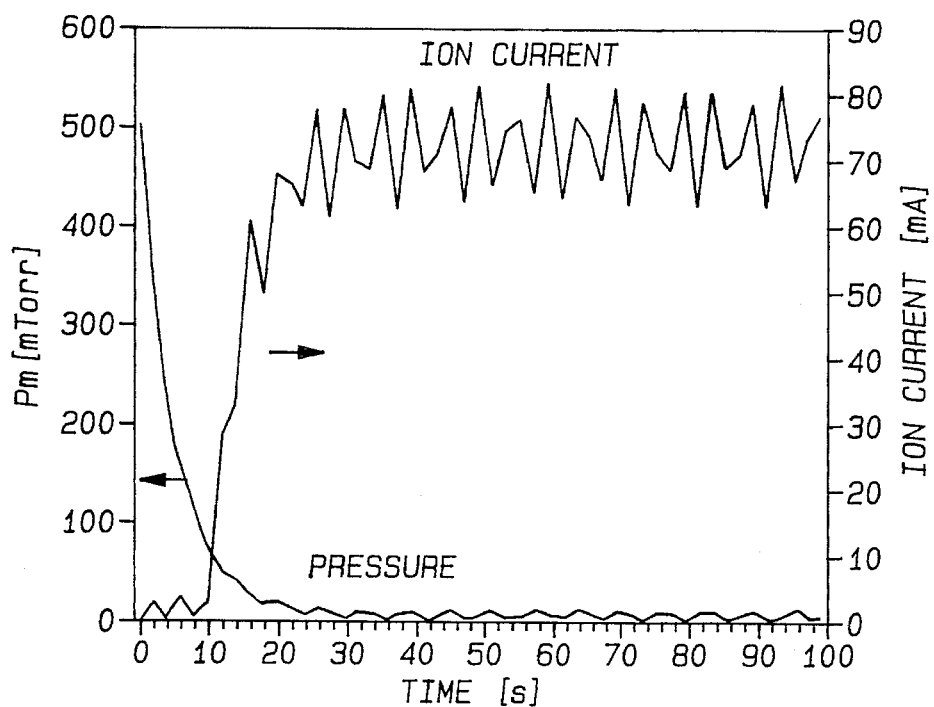
FIG. 13 is a graph illustrating process gas pressure, and ion current at the substrate, both as a function of time from arc ignition.
Figure 14:
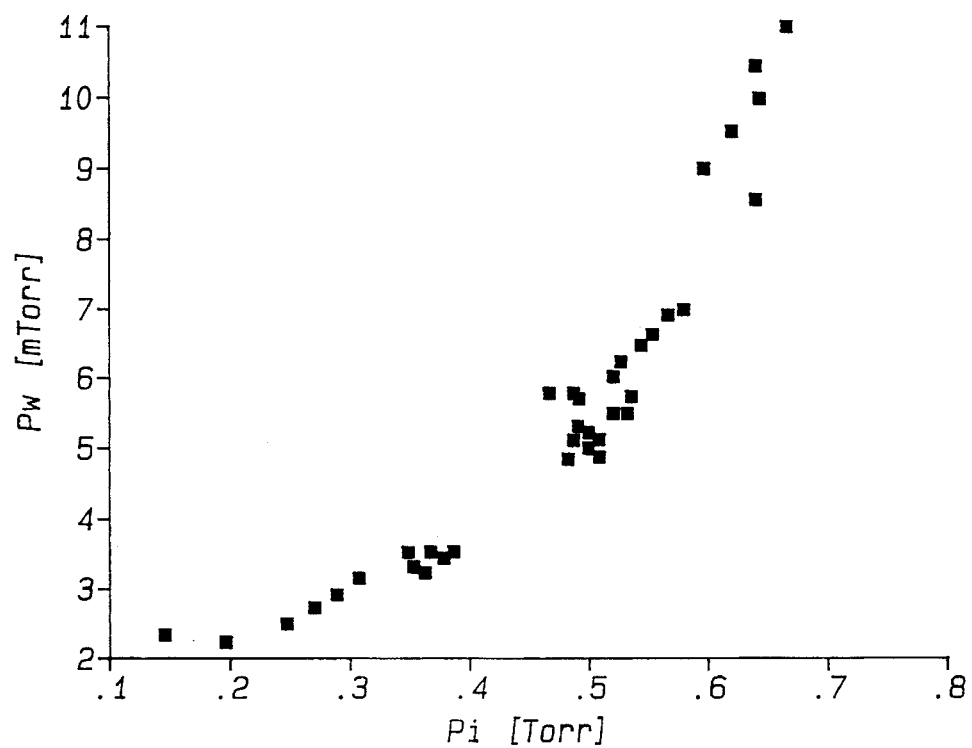
FIG. 14 is a graph illustrating steady state working process gas pressure as a function of the initial gas pressure.

Another preferred embodiment takes advantage of a surprising and disproportionate effect of arc pumping of the gas present in the vacuum chamber. It is well known that freshly prepared surfaces of chemically active metals can absorb gases, and this phenomena is utilized in the construction of ion pumps and sublimation pumps, where the active metal is usually titanium. Using a system, such as illustrated in FIGS. 11 and 12, with tin as the active cathode metal 225 and oxygen as the gas, applicants found a very strong pumping effect, which was surprising both because of its occurrence with tin as the active metal and because of the strength of the pumping action. In fact, the pumping speed attributed to the arc action was many times greater than the pumping speed of the vacuum pumps employed. Because of this effect, if applicants merely adjusted the gas flow rate pressure prior to arc ignition to yield in the presence of pumping by the vacuum pumps the desired deposition gas pressure, the gas pressure would fall rapidly and drastically after arc ignition, yielding a gas pressure which was far below the required pressure, and producing opaque metal-rich coatings. In a preferred embodiment, the gas flow rate is adjusted such that the steady-state pressure during the arc is appropriate for producing the appropriate oxide coating with the desired oxygen content for obtaining a conductive transparent coating. Under these conditions, the initial gas pressure, $P_i$, i.e., prior to arc ignition, is many time higher than the steady state working pressure, $P_w$. The process of arc pumping is illustrated in FIG. 13, which shows a schematic graph of the gas pressure as a function of time from arc ignition, showing a drastic decrease of the gas pressure by some two orders of magnitude during the first few seconds of the arc. Also shown is a graph of ion current measured by a probe placed in the vicinity of the substrate and connected to the cathode. The ion current is a measure of the arrival rate of plasma ions to the substrate. Applicants noted that the ion current is negligible at arc ignition, as the overpressure of gas prevents the metal plasma ions from arriving and hence prevents the formation of an opaque metal coating. As the gas is pumped by the arc, the ion current increases so that when a steady state gas pressure is achieved, a steady state average ion current is also obtained. FIG. 14 shows the relation between the initial gas pressure $P_i$ and the steady state working pressure $P_w$ for one specific set of operating conditions.

Figure 15:
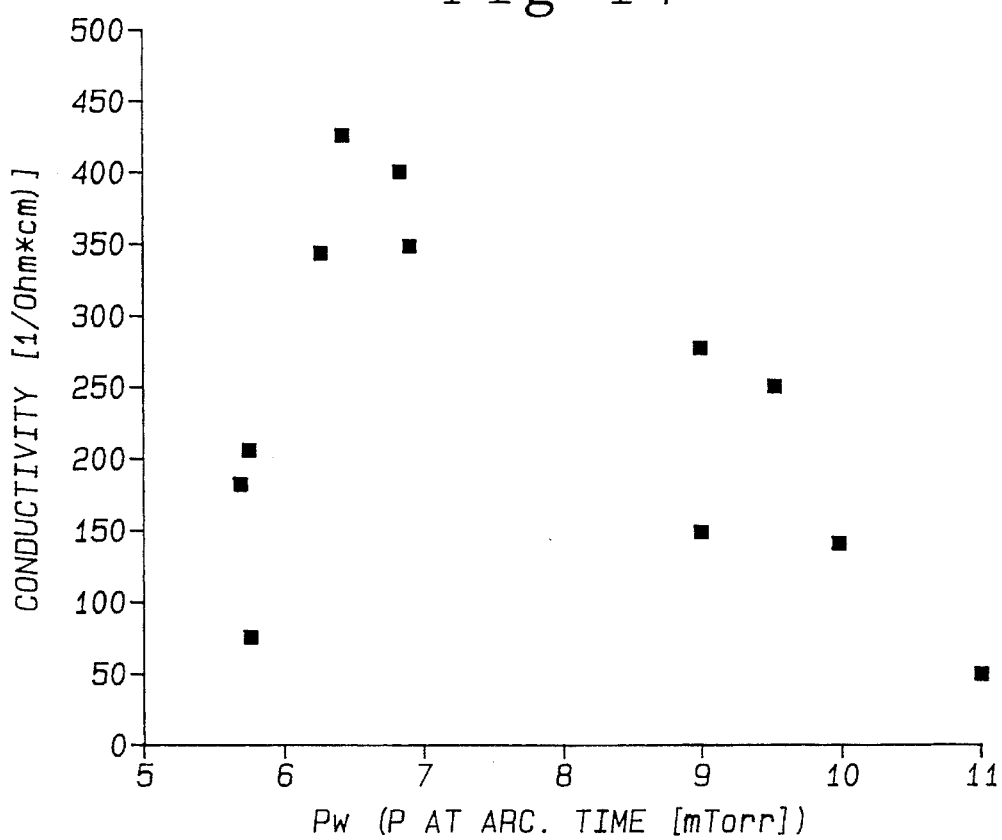
FIG. 15 is a graph of the conductivity of Sn—O coatings, as a function of oxygen gas pressure.

Adjustment of the gas pressure is critical for producing high quality conductive and transparent coatings. If the gas pressure is too low, a metallic coating forms, which may have high conductivity, but is opaque. If the gas pressure is too high, a stoichiometric metal oxide, which is generally insulating, forms. Also, if the pressure is too high, metal ions from the cathode spots do not reach the substrate, and thus the deposition rate will decrease with increasing gas pressure. Thus, to obtain transparent coatings with the highest conductivity, an optimal value of gas pressure is required. FIG. 15 illustrates the conductivity of coatings obtained with a particular set of process parameters as a function of the gas pressure. The highest conductivities are obtained in a particular range of gas pressure approximately between 6 and 7 mTorr.

Conditions at the substrate during the deposition process play an important role in determining the microstructure of the coating and its performance parameters, such as optical transmission and electrical conductivities. In one preferred embodiment of the present invention, the substrate is heated during deposition. In another preferred embodiment, the coating is electrically biased during deposition. If a negative bias voltage is applied to the coating during deposition, the impacting positive ions are accelerated, which can give the ions the ability to sputter weakly bound atoms from the coating surface, thus building a denser and stronger coating.

Figure 16A:
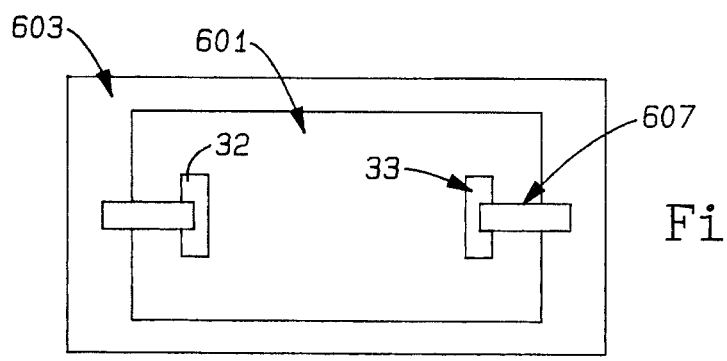
FIG. 16(a) is a schematic top plan view of a substrate holder which provides a transverse flow of electrical current.
Figure 16B:
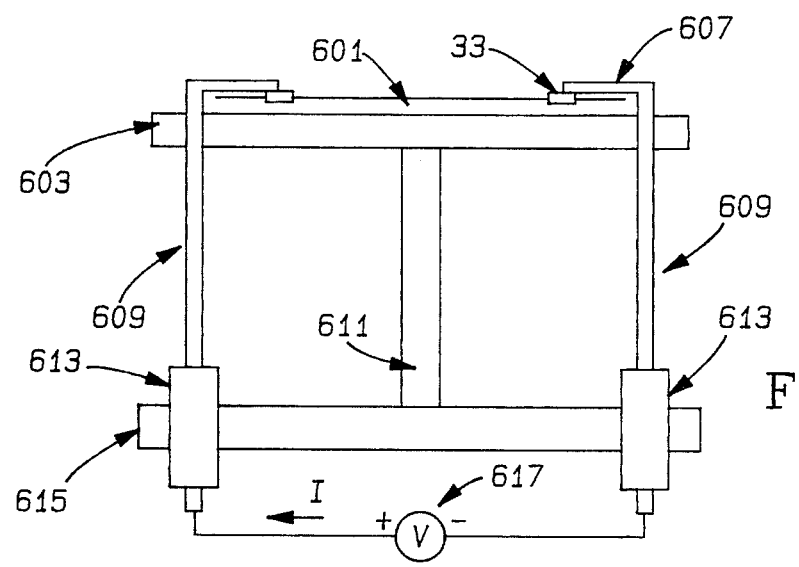
FIG. 16(b) is a schematic elevational view of the substrate holder shown in FIG. 16(a)

An electrical field is applied parallel to the surface of the substrate, causing a flow of current in the conductive coating as it is being deposited parallel to the substrate coated surface. In the case of an insulating substrate, such as glass or transparent plastic, the electric field may be applied in one preferred embodiment by fabricating a pair of electrodes on the substrate surface. This may be done, for example, by depositing through a mask having an opening of the desired shape a metal coating by any of the known deposition techniques, including vacuum arc deposition, or by applying a layer of metallic paint in the desired shape to the substrate and allowing it to dry. The substrate arrangement is illustrated in FIG. 16(a) which shows a top plan view of the substrate 601 mounted on a holder adapted for this preferred embodiment, and FIG. 16(b) which shows a front elevational view of the substrate and its holder. The electric field is applied by providing an electrical connection between each such electrode, one of which is labeled 33, and a pole of a voltage source 617 by means of electrical conductors 607 and 609. In one embodiment, the electrical connector 607 is made from a spring material and serves also to mechanically hold the substrate 601 onto a supporting platform 603. In FIG. 16(a) and 16(b), supporting platform 603 is made from an insulating material. It may alternately be fabricated from a conducting material, in which case insulating feedthroughs must be supplied where conductors 609 pass through 603. Alternatively, if conductors 609 are rigid, a design which does not require either 603 or 611 is possible if conductors 607 are in the form of a clamping device which provides mechanical support for substrate 601 as well as electrical contact to its electrodes 33. In other embodiments, the electrical and mechanical connections may be provided by separate means. The supporting platform 611 may be attached to and spaced from the flange 615. If the flange 615 is made from metal or another conducting material, the electrical connections 609 may pass outside the vacuum system by means of the leakproof insulating feedthroughs 613. In order to implement other aspects of the present invention, prior art means for measuring the current I flowing in the electrical circuit may optionally be provided, such as a series current viewing resistor (shunt) or Hall effect current probe (not shown in FIG. 16(a) or 16(b)).

Figure 17:
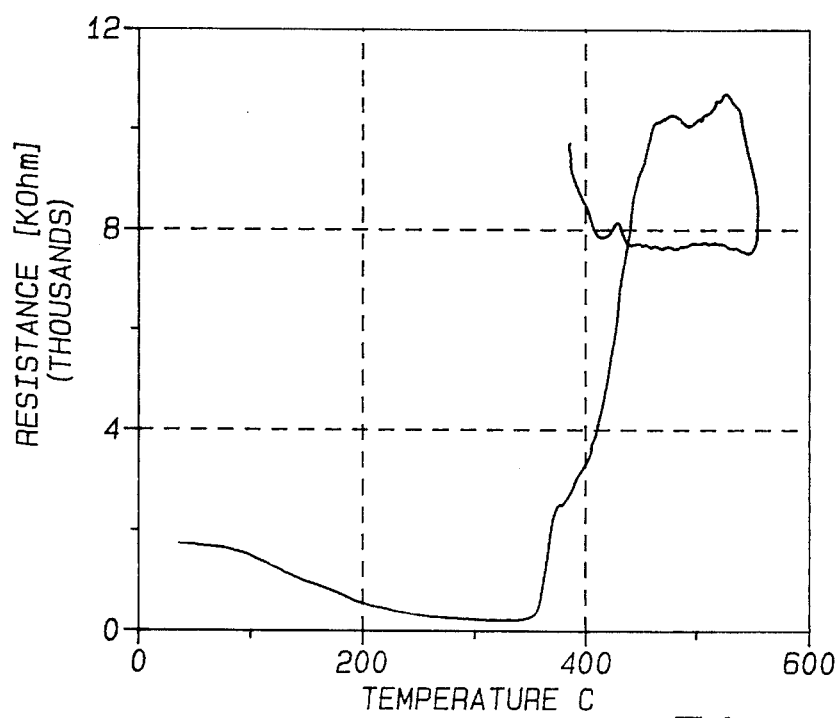
FIG. 17 is a graph of the electrical resistance as a function of the temperature of the coating, while heating the coating after deposition.
Figure 18:
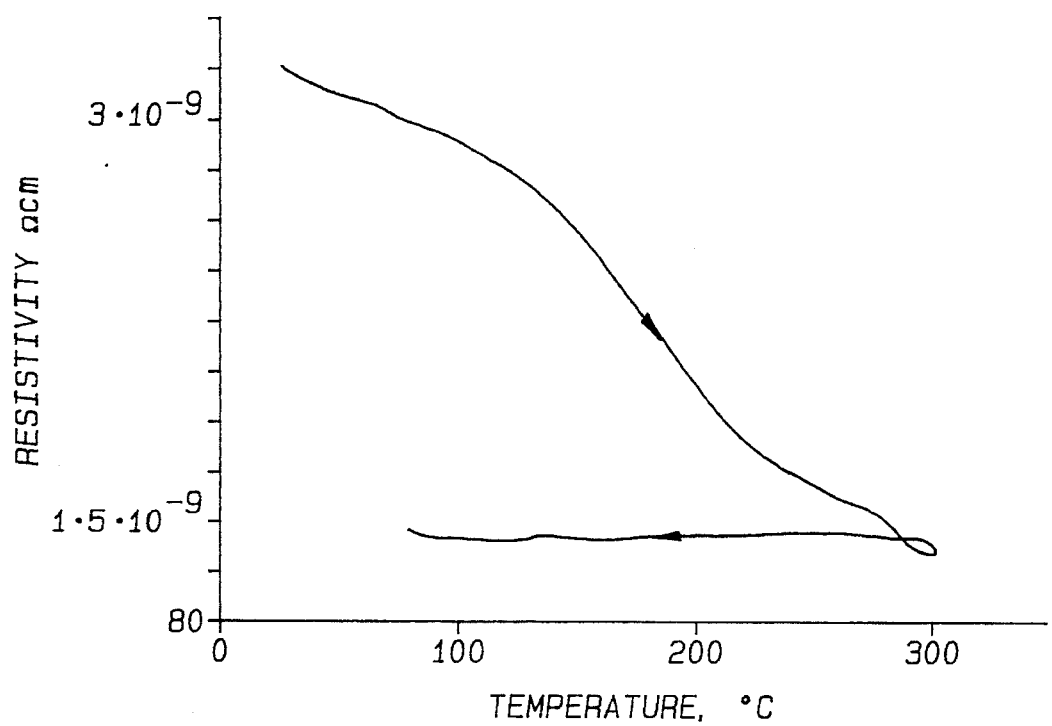
FIG. 18 is a graph of the resistivity of the coating as a function of temperature during a post deposition annealing cycle.

Applicants have found that the conductivity of the conducting transparent layers can be improved by heating the sample after the coating process. This process is known as thermal annealing. In one preferred embodiment of the present invention, post deposition heating is carried out rapidly and maintained for a relatively short period of time. The process is known as rapid thermal annealing, or RTA. RTA is applied to conducting transparent coatings initially prepared according to the aspects of the invention previously described. Generally, annealing may improve the conductivity of material by relieving internal stress and by promoting crystalline grain growth. It is generally held that the best conductivities of metals, for example, occur in perfect crystals, and thus according to the generally accepted teachings, conductivity is improved as conditions approach a perfect crystal microstructure, i.e., a crystalline microstructure with large grain size. The microstructure of as deposited Sn—O coatings using the method of this invention without substrate heating or bias were found to be amorphous, rather than crystalline. Recrystallization occurs only at relatively high temperatures, e.g., above 450° C., which would be impractical to utilize in many applications where the substrate is glass or other low temperature materials. Surprisingly, however, applicants found that a 30-second RTA pulse with a peak temperature of 300° C. made a marked improvement in the conductivity, sometimes by a factor of 20 or more, even though the coating material maintained an amorphous microstructure. FIG. 17 shows a graph of the resistance versus temperature of a sample transparent conductive coating subjected post deposition heating. A minimum in the resistance occurs at a temperatures in the range of 300°–350° C. FIG. 18 shows a graph of the resistivity of a sample as a function of temperature subjected to a thermal annealing cycle. A non-reversible decrease of the resistivity occurs as a result of the applied heat pulse. It is suggested in the present invention as a possible mechanism of action, without limiting the scope of the invention defined by the specific claims made, that the heating increases the mobility of the atoms and allows them to arrange themselves in a more optimal arrangement for electrical conduction on a short range basis, but without coming to a long order arrangement characteristic of a crystalline structure.

In another embodiment of the present invention, continuous control of a critical process parameter is applied on the basis of an electrical signal which relates to the electrical conductivity of the layer being deposited at that instant. The electrical signal is derived from the current I flowing through the coating, as illustrated in FIG. 16(a) or 16(b). The current I, however, is related to the integral of the specific conductivity across the thickness of the coating and hence the integral of the increment in conductivity as a function of time:

$$I(t) = \frac{w}{L} \int_0^{d(t)} \sigma(y) dy = \frac{w}{L} \int_0^t \sigma(t) v_d(t) dt$$

where w is the width of the coating, L is the length of the coating, y is the height of a particular layer within the coating, measured from the front surface of the substrate, d is the thickness of the coating, σ is the conductivity of the coating material, which may vary with time, and hence position with respect to the distance from the substrate surface, if deposition conditions are not held constant and $v_d$ is the deposition rate. The time derivative of I, $$\frac{dI}{dt} = \frac{w}{L} \sigma(t) v_d(t)$$

gives an indication of the conductivity of the layer being deposited at that instant. In many applications, it is desirable to optimize this value. The need for real time control can be appreciated if one takes into account that arcs are intrinsically statistical in nature, and the instantaneous plasma flux may vary, for example, as the cathode spot meanders to different portions of the cathode surface.

Critical parameters which affect the conductivity of the coating include the gas pressure, arc current, substrate temperature, substrate bias potential, and the magnetic field strength. Measurement and processing of dI/dt provides a means for adjusting a critical parameter to its optimum value for maximizing the conductivity.

Figure 19:
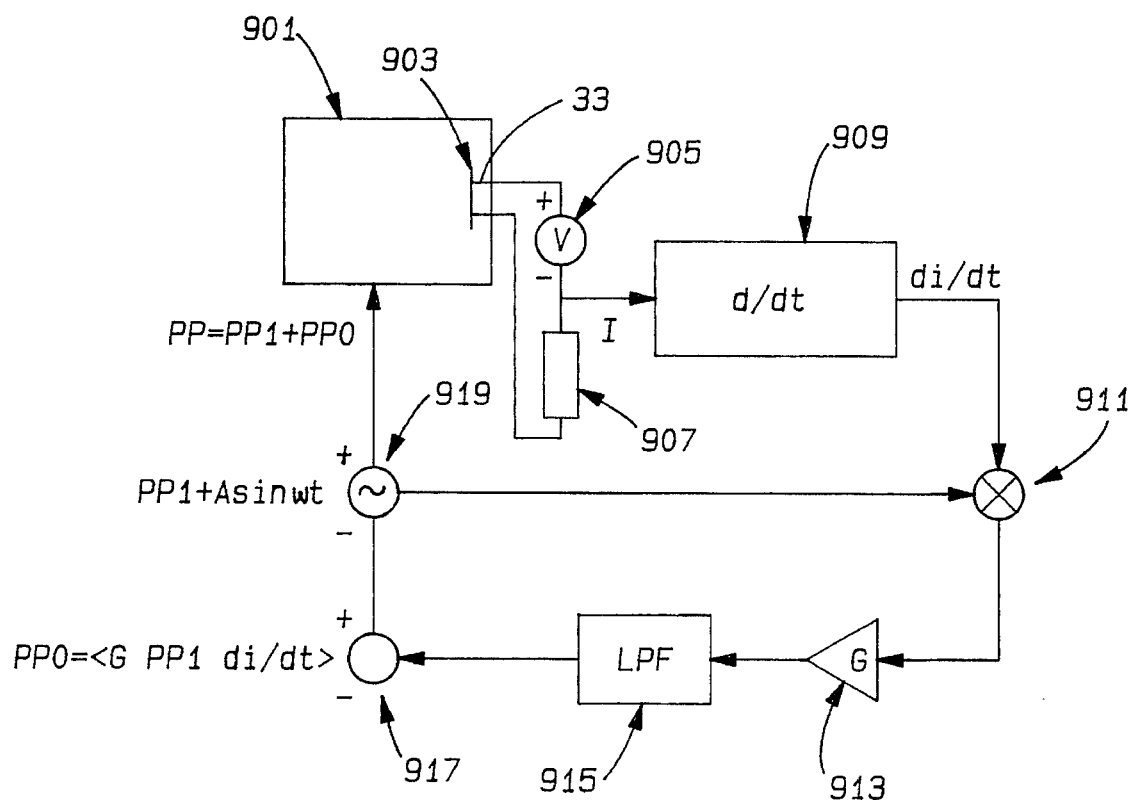
FIG. 19 is a block diagram illustrating a circuit to control a critical process parameter in order to maximize the electrical conductivity of the growing coatings.

One preferred method of accomplishing this is illustrated in FIG. 19. The deposition system and process is represented schematically by 901, which may have one or more process parameters which may be varied, including, but not limited to pressure, arc current, substrate temperature, and transverse electric field on the substrate. One selected process parameter is noted as PP, whose value is the sum of two signals, noted as PP0 and PP1. The two signals are generated by sources 917 and 919. These may be voltage or current sources in some cases, for example the substrate bias voltage, or the magnetic field coil current. In other cases they may represent the control signal to a transducer which ultimately controls a process parameter, for example the control voltage to an electrically operated gas flow needle valve. The source 917 produces a constant, or slowly varying non-periodic process parameter signal PP0. Initially, PP0 is set at a value that previous tests have indicated is the average optimum value for PP. Source 919 produces a small amplitude, sinusoidally varying signal PP1 which is superimposed, or added to PP0. Conductivity sensor 903 represents a sample substrate equipped with electrodes, as described above and illustrated in FIG. 16(a) and 16(b). A constant voltage V is generated by voltage source 905, and is imposed between the two electrodes of 903. The current flowing in the coating is measured by current measuring device 907, which may be for example a resistor having a low resistance in relation to the resistance of the coating on 903. The current signal will be passed through the differentiator 909. The derivative of the current signal, dI/dt, and the sinusoidally varying process parameter signal, PP1, will be multiplied together by multiplier 911. The resultant product signal is amplified by a factor of G by the amplifier 913, which is equipped with a narrow band filter around the frequency e of PP1. G may have negative or positive values. The amplified signal is then passed through a low pass filter 915, which then yields the average value with less periodic variation. This signal is then used to set the value of PP0. The overall control scheme includes the important novel feature that the control signal is proportional to the derivative with time of the coating conductivity. The above scheme could, in principle, be realized using analog electronic circuitry. However, given the large time constants governing some of the process parameters, the control scheme can more readily be realized using a digitally programmable controller, computer, or other microprocessor based device. In this case, the various processing steps illustrated by circuit sections 909, 911, 913, and 915 are accomplished by mathematical algorithms that one skilled in the art of computer programming can readily devise and reduce to computer program code. Various modifications are possible and may be desirable for certain applications. For example, the current signal I may include an appreciable high frequency noise component, due to conduction through the plasma adjacent to 903, in addition to conduction through the coating. Differentiation will tend to exaggerate the noise component. Improved and more stable performance can be obtained by filtering either or both of the I and dI/dt signals, to remove the high frequency components.

The operation of this invention can be more easily understood and appreciated through several specific examples.

EXAMPLE 1

Transparent conducting Sn—O coatings were produced with the system illustrated schematically in FIG. 3 and using the assemblies illustrated in FIGS. 11 and 12. The outer diameter of cathode cup 201 was 93–95mm and its height was 40 mm. The cavity 203 had a diameter of 90–93 mm, and a depth of 15 mm. Cavity 203 was filled with commercial grade pure tin. Coil 207 had an inner diameter of 20 mm, and outer diameter of 40 mm, a height of 10 mm, and consisted of 100 turns of 1 mm diam wire. The upper edge of the coil was located 15 mm from the upper surface of cathode 201. Water was used as the coolant.

The above-described cathode 81 was mounted in the system illustrated in FIG. 11. The anode 82 had an inner diameter of 122 mm and a height, or thickness, of 30 mm. The distance between the planes defining the lower surface of the cathode and the upper surface of the anode as positioned in FIG. 11 was 10 mm. The parts of the macroparticle filter assembly 80, namely, torroidal section 83 and deposition chamber 37 are each fabricated from 160 mm diameter stainless steel pipe. The macroparticle filter baffle plates 84 had an inner diameter of 100–110 mm. Five 625 turn coils 85 were wrapped directly on the torroidal macroparticle filter 83. The two Helmholtz coils 86,87 each had 700 turns and had an inner diameter of 225 mm. The length of chamber 37 was approximately 200 mm.

The chamber 37 was pumped by a mechanical rotary vane pump with an estimated pumping speed at the 63 mm diam pumping port 88 of 1 l/s. In a typical coating cycle, the gas flow is set so that the initial pressure is in the range of 100–1000 mTorr. The arc current was set to 160 amps, and the current in the various coils, including the interior cathode coil 207, all five coils 85 on the macroparticle filter and the Helmholtz coils 86,87 were set to 2 amps. The arc was ignited using an auxiliary trigger electrode (not shown) which makes momentary contact with the cathode 81. Following arc ignition, the pressure in chamber 37 falls to a working pressure of 3–10 mTorr in approximately 10 seconds, as illustrated in FIG. 13. The arc was maintained for a period of 50–200 seconds, after which the chamber was opened and the substrates removed. Transparent coatings with a thickness of up to 1 μm were observed, indicating a deposition rate of up to 100 Angstroms per second. The conductivity of the coating material as a function of the working pressure is illustrated in FIG. 15.

EXAMPLE 2

Samples were prepared in the manner described in Example 1, and then placed in an apparatus that heats the substrate in vacuum, while the resistivity was monitored via electrical measurements made to contacts applied to the surface of the coatings with metallic paint. The change in resistance of a Sn—O deposition on a glass sample during the course of heating to 500° C. at a heating rate of 3° C./min is illustrated in FIG. 17. Minimal resistance, and hence improved conductivity, is noted in the temperature range of 300°–350° C. The resistivity of a sample during an annealing cycle with a heating rate of 3° C./min to a maximum temperature of 300° C., and then cooling, is shown is FIG. 18, which shows that a non reversible decrease in the resistivity occurred. Other examples of resistivity decreases resulting from slow annealing of Sn—O coatings to a temperature of 300° C. are noted in the table below:

| resistivity - before $10^{-3}$ Ωcm | resistivity - after $10^{-3}$ Ωcm |
|---|---|
| 3 | 1 |
| 6 | 2 |
| 7 | 1 |
| 3 | 0.9 |
| 5 | 1.5 |
| 9 | 7 |

Even greater improvements in the conductivity, or reductions in the resistance, can be realized by applying the thermal processing rapidly, i.e., using rapid thermal annealing (RTA), which may be carried out in an atmosphere of Ar, N, or air. Examples of resistivity decreases in Sn—O coatings exposed to RTA, where the heating rate was 50° C./s, and a maximum temperature of 300° C. was then maintained for 30 s in an air or Ar atmosphere are given in the table below:

| resistivity - before $10^{-3}$ Ωcm | resistivity - after $10^{-3}$ Ωcm |
|---|---|
| 3 | 0.8 |
| 3 | 0.6 |
| 2 | 0.6 |
| 6 | 0.6 |
| 9 | 0.5 |
| 3 | 0.8 |

When the RTA was performed for 30 seconds at a temperature of 450° C., no increase in conductivity was observed.

EXAMPLE 3

Sn—O coatings were prepared as in example 1, with the addition that metallic paint electrodes were applied to the substrates, and then they were mounted on a holder similar to that described in FIGS. 16(a) and 16(b), which was mounted at the end of the filtered vacuum arc deposition system. The electrodes were 4 mm wide by 25 mm long stripes, placed parallel to each other and separated by 20 mm. A voltage was applied between these electrodes from a 9-V battery, and the current drawn from the battery was measured during the arc by measuring the potential drop across a 10 Ω resistor in series with the substrate and voltage source. The current is initially zero, but quickly jumps once the arc is ignited, due to conduction through the plasma. The current then rises approximately linearly with time until the end of the deposition cycle, and then has a small negative jump at the end of the arc as the plasma path is remove. The final resistivity is typically $3\times10^{-3}$ Ωcm. Control samples were prepared with silver paint electrodes and identical deposition conditions, but without attaching the electrodes to a voltage. The resistance after deposition of the control sample was $6\times10^{-3}$ Ωcm, and thus the application of the voltage caused an increase in the conductivity by a factor of two (2).

Figure 20:
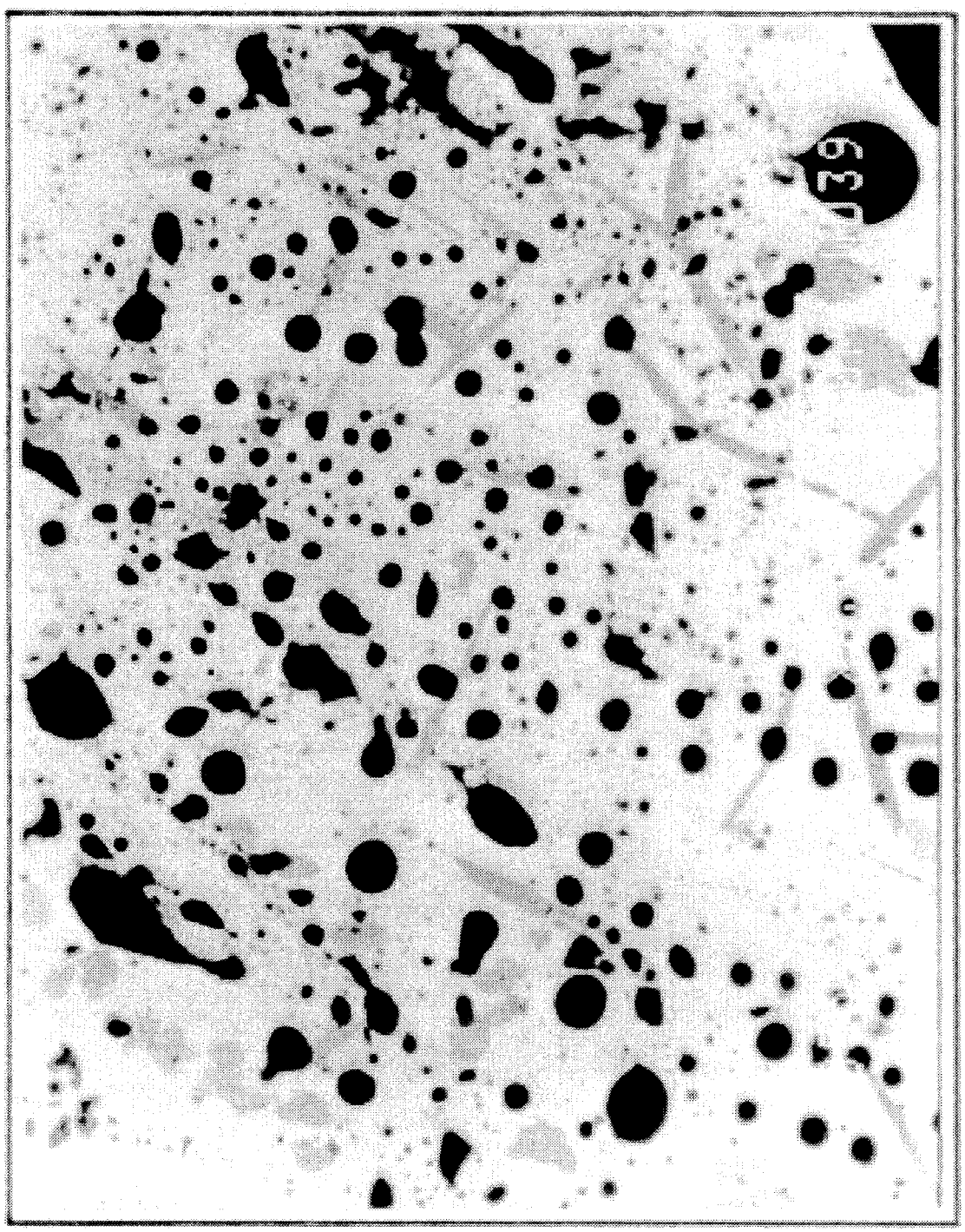
FIG. 20 is an electron micrograph illustrating the surface structure of the coating applied with no surface current applied on the coating surface.
Figure 21:
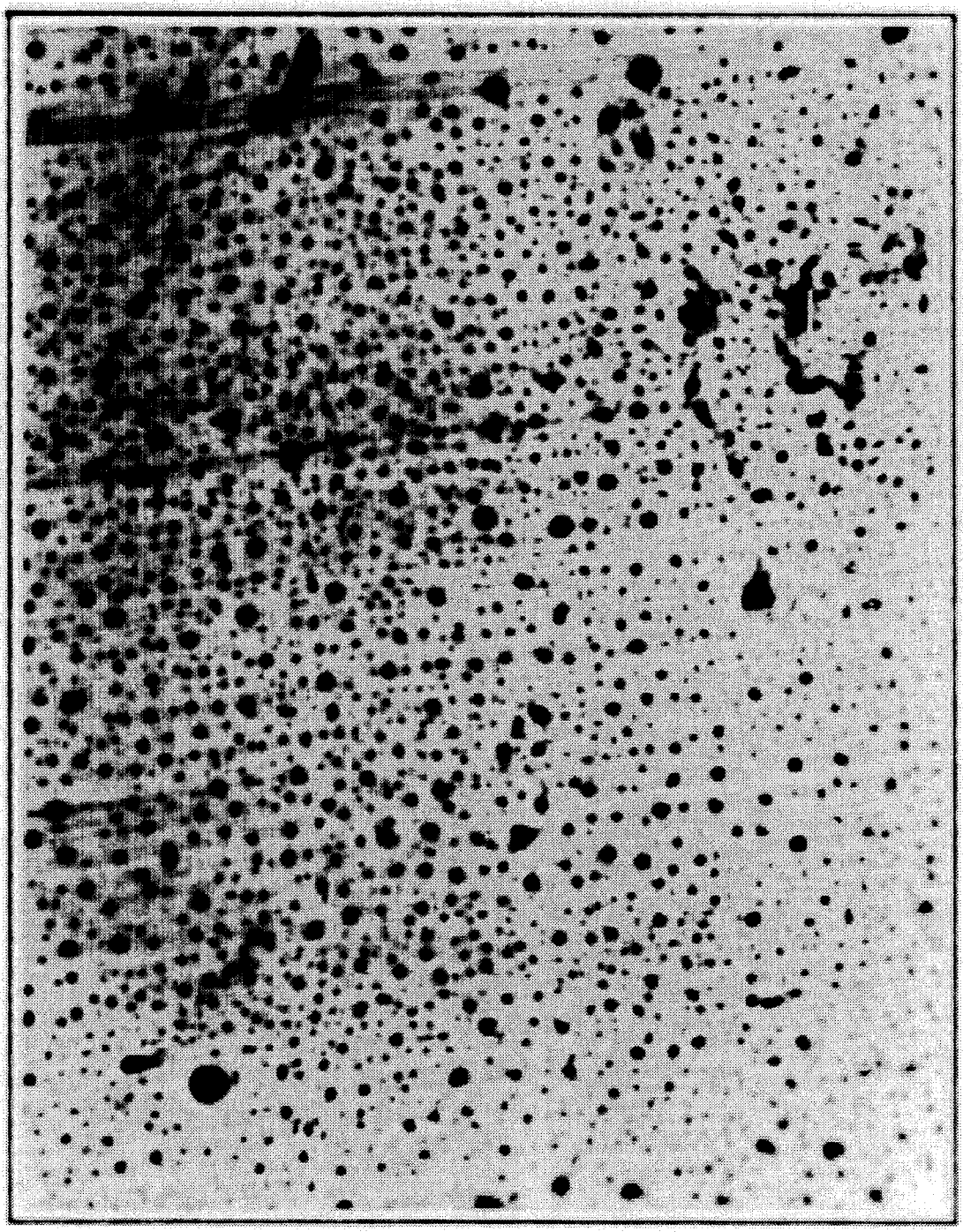
FIG. 21 is an electron micrograph illustrating the surface structure of the coating surface applied with a surface current.

Four-point probe measurements indicate that the conductivity is anisotropic: higher conductivities are observed in the direction of electric field applied during the deposition process (i.e., in the direction from one of the silver paint electrodes to the other) than in the direction perpendicular to the said electric field. X-ray diffraction measurements show clear differences in the x-ray structure, depending on the orientation of the substrate (i.e., if the incident x-ray beam is parallel or perpendicular to the direction of the previously applied electric field. Scanning electron microscope (SEM) observation, as shown in FIG. 21, reveals the presence of a dispersion of minute, approximately round, structures on the surface of the substrate, which appear dark in the SEM image. When an electric field was applied during deposition, these structures tend to be finer (diameter of 0.01 μm, typically), and tend to be arranged in strings, which are parallel to the direction of the applied electric field. FIG. 20 which is a micrograph of prior art depositions with no applied electric field with all other parameters being the same. The structure shown in FIG. 20 can be readily compared with FIG. 21.

The above observations suggest a mechanism of action, which is offered here only as a hypothesis, and as an aid to understanding the phenomena, but without limiting the scope of our invention, which is delineated in the claims. A possible interpretation is that the round structures are microcrystallites, which are dispersed in a continuous amorphous matrix. Probably the crystallites have a higher local conductivity than the surrounding amorphous material. The presence of the electric field encourages the crystallization of the material, and provides an additional driving force for transporting depositing ions to favorable growth locations, at the poles of existing crystallites with respect to the electric field direction, where the local electric field should have its maximum value.

Figure 4:
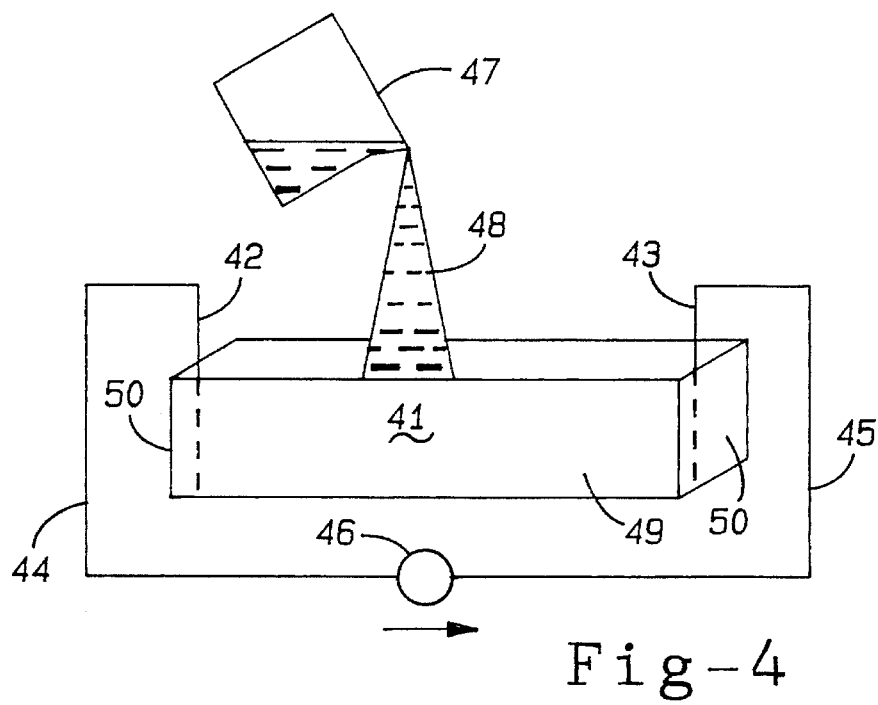
FIG. 4 is a schematic view illustrating a third embodiment of the invention.

Another embodiment of the invention is illustrated in FIG. 4. A casting process incorporates a casting mold 41 provided with electrodes 42,43 that are connected by means of conductors 44,45 to a source of electrical current 46. When casting ladle 47 is discharged, the molten material 48 flows into the mold 41 and comes into contact with electrodes 42,43 facilitating the passage of current through the material during the casting process and while the material cools and solidifies. Electrical current is passed through the material after it is cast into a mold. The current may flow either during the solidification process or during the cooling process, or both, depending on the material being cast and the effect desired. The electrical current may be introduced by means of discrete electrodes, or preferably the ends of the mold 50 are fabricated from a conductive material and they serve as the electrodes, while the side walls 49 of the mold are preferably fabricated from an insulating material.

As an example, the material to be processed 48 may be tin. The mold 41 is constructed of a material which maintains its structural integrity when the liquified processed material is cast therein. In the case of tin, the mold may be boron nitride. The dimensions of the mold are chosen in accordance with the desired size of the resultant solid object. As an example, a mold with interior dimensions of 5×8×40 cm will produce a solid object of approximately that size. The electrodes 42,43 preferably maintain their structural integrity when the liquified material come in contact with them and must be electrically conductive. In the present example, the electrodes may be made from 5 mm diameter graphite rods. Preferably, a series of trials at various current levels are conducted prior to full scale production in order to determine a current which optimizes a desired property in the processed material. Generally, current densities in the range of 0.1 to 5 A/mm$^2$ have been found to be advantageous in most embodiments.

Figure 5:
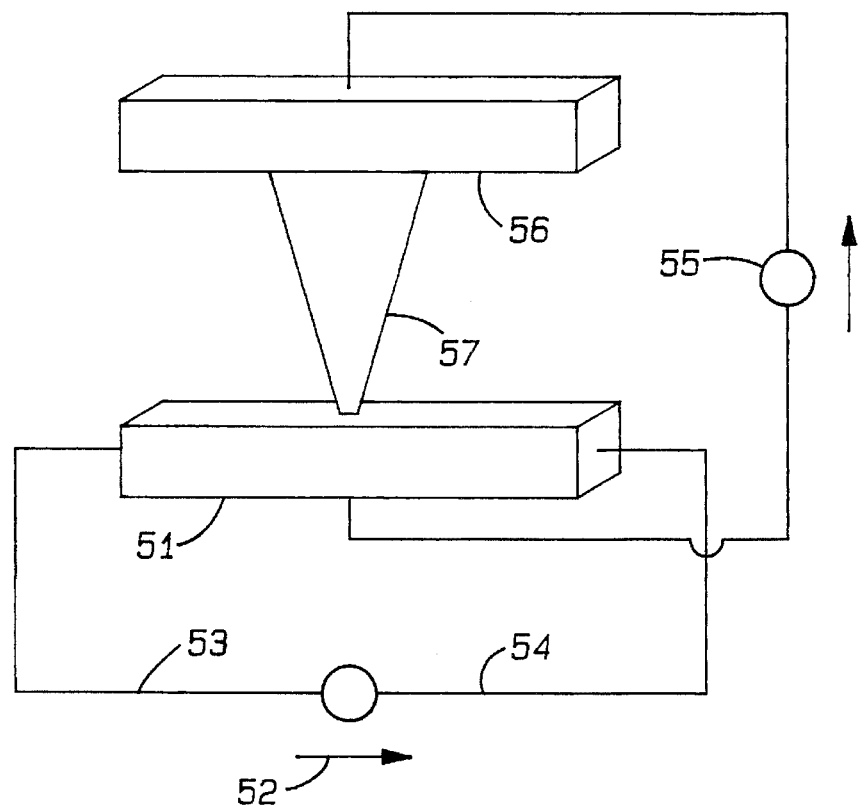
FIG. 5 is a schematic view illustrating a fourth embodiment of the invention.

Another embodiment of the invention is illustrated in FIG. 5. The material to be processed 51 is connected to a source of electrical current 52 by means of electrical conductors 53,54. An additional source 55 for supplying electrical current is connected to the material to be processed 51 and electrode 56, and an electrical discharge illustrated schematically as 57 is made to occur between the members 51,56. While in this diagram, electrode 56 serves as the discharge anode and the material to be processed 51 serves as the cathode, the opposite arrangement may also be employed.

Figure 6:
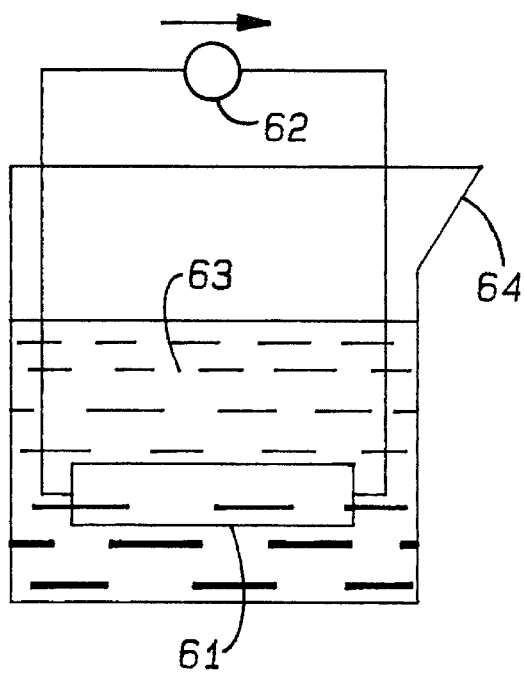
FIG. 6 is a schematic view illustrating a fifth embodiment of the invention.

While in the above embodiments and examples, the processing occurred before employment of the material in its service environment, in other embodiments, the service environment serves to process the material. Yet another embodiment of the invention is illustrated in FIG. 6. An immersion process has the material to be processed 61 connected to a source of electrical current 62 while it is immersed in a liquid 63 contained in vessel 64. In this example, where the service environment processes the material, the liquid may be corrosive. As an example, we have placed steel specimens in a 3% aqueous solution of NaCl, which tends to corrode the steel. By flowing a current of 0.4 A/mm$^2$ through the steel specimen, we decreased the corrosion rate as measured by mass loss by 50%. The invention may be used to increase the corrosion resistance of materials and components.

In the present invention, substantially all the electrical current is through the conducting material as opposed to prior art cathodic protection process which pass electrical current between an immersed material and a liquid in such a manner as to ensure that the immersed material is the most cathodic element in the liquid. While an insignificant part of the current might happen to pass from the material to the liquid, if the liquid is electrically conductive and back again into the material, no cathodic protection is provided the material via the prior art method under these circumstances. Indeed, while one end of the conductor might be rendered slightly and insignificantly more cathodic with respect to the middle of the conductor, the other end would be rendered more anodic. Rather a new and unexpected phenomena occurs, whereby the flow of current within or along the material is responsible for an improvement of the corrosion resistance of the material.

Figure 7:
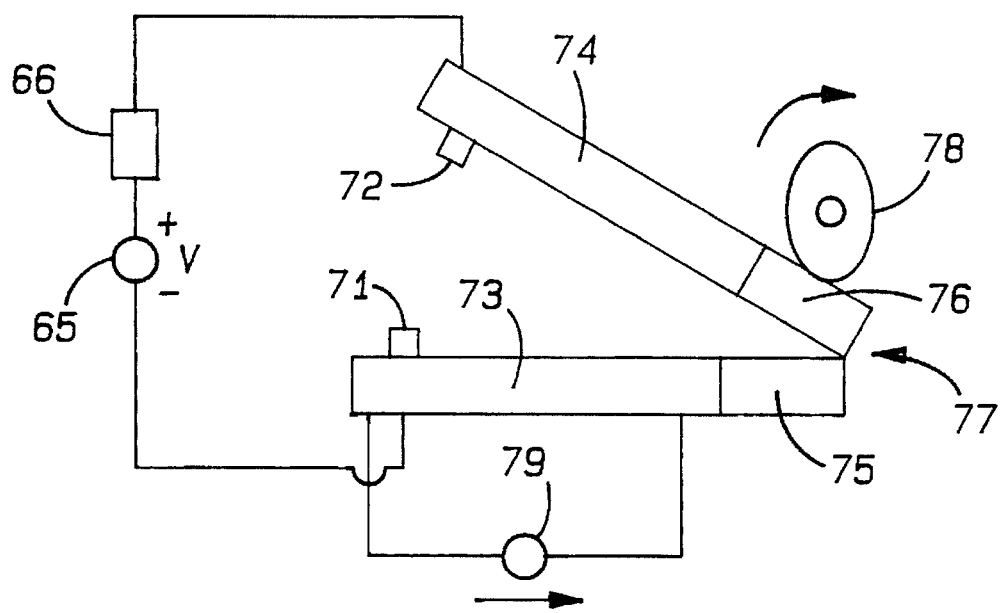
FIG. 7 is a schematic view illustrating a sixth embodiment of the invention.

A further embodiment of the invention in the form of electrical switching devices is illustrated in FIG. 7. Electrical contacts 71,72 are mounted on conducting members 73,74 which are joined to insulating members 75,76. The two insulating members are connected to a spring 77, which tends to separate the lower assembly 71,73,75 from the upper assembly 72,74,76 at an acute angle. A means is provided to periodically close the angle separating the upper and lower assembly, here illustrated by a rotating elliptical cam 78. The lower insulating member 73 is provided with an electrical current which flows along its length by current source 79. Some fraction of the electrical current will flow within the lower contact 71 in a direction generally perpendicular to the axis defining the contact motion upon separation and generally parallel to the face of the contact 71, which comes in contact with contact 72. The contacts 71 and 72 periodically open and close the electrical circuit which may include a source of electrical voltage 65 and load 66. The load may contain an inductive element. While for the sake of illustration the additional current is here applied to the cathode of the switch, it may be applied also to the anodic contact, or to both contacts.

In this embodiment, where the service environment processes the material, the process is electrical arcing. As an example, a steel anode in a pulsed air arc with 100 μs pulse duration, 1 J of energy per pulse, and a 100 Hz pulse repetition rate, passing a current density of 0.6 A/mm$^2$ through the anode transverse to the axis of the arc produces a reduction in arc erosion of the anode by a factor of 2 to 2.5. Similar results were obtained from other materials, such as TiC-WC-Co alloy. This effect can be profitably exploited to extend the electrode lifetime in devices which employ arcs. Examples include high power circuit breakers, the non-eroded electrode in electrical discharge machining apparatus, and the electrical contacts in automobile ignition circuits. In the latter case, the invention was examined in a test rig in which commercially available contacts were mounted, and subjected to repeated opening and closing operations during which the contacts interrupted a current of 10 mA. The commercially available contacts were modified by injecting a current transverse to the axis of the arc of 0.75 A. The contacts modified by this invention had a reduced arc erosion rate by a factor of 5–6 in comparison with the unmodified commercially available contacts.

Figure 8:
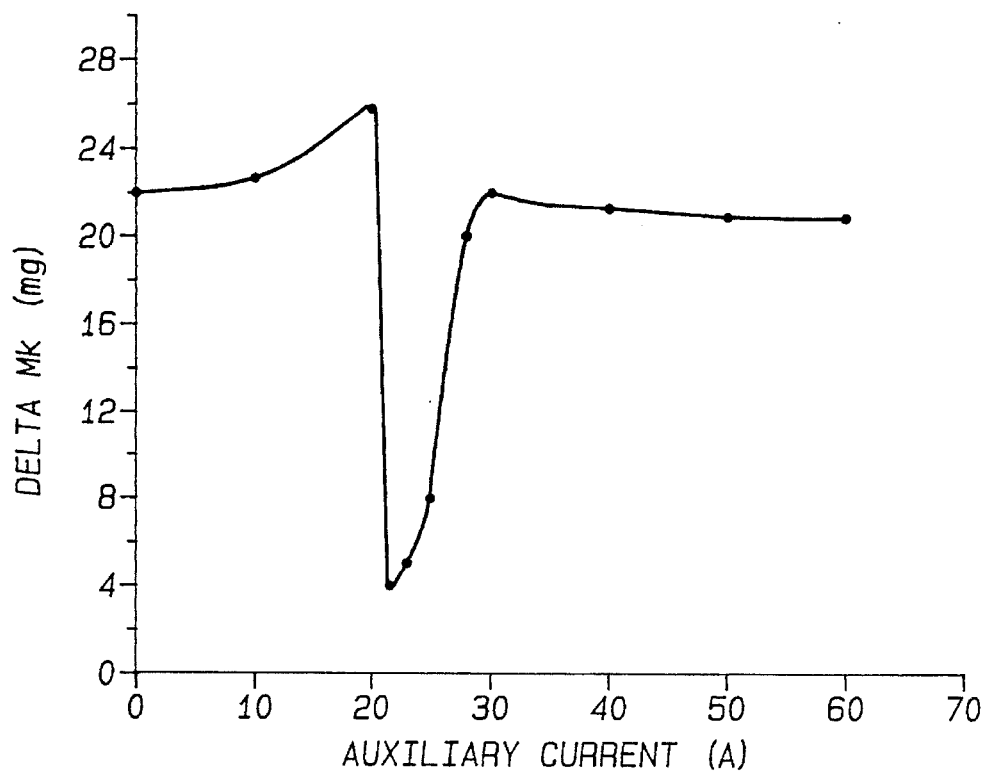
FIG. 8 is a graph illustrating experimental results with varying amperages of current.
Figure 9:
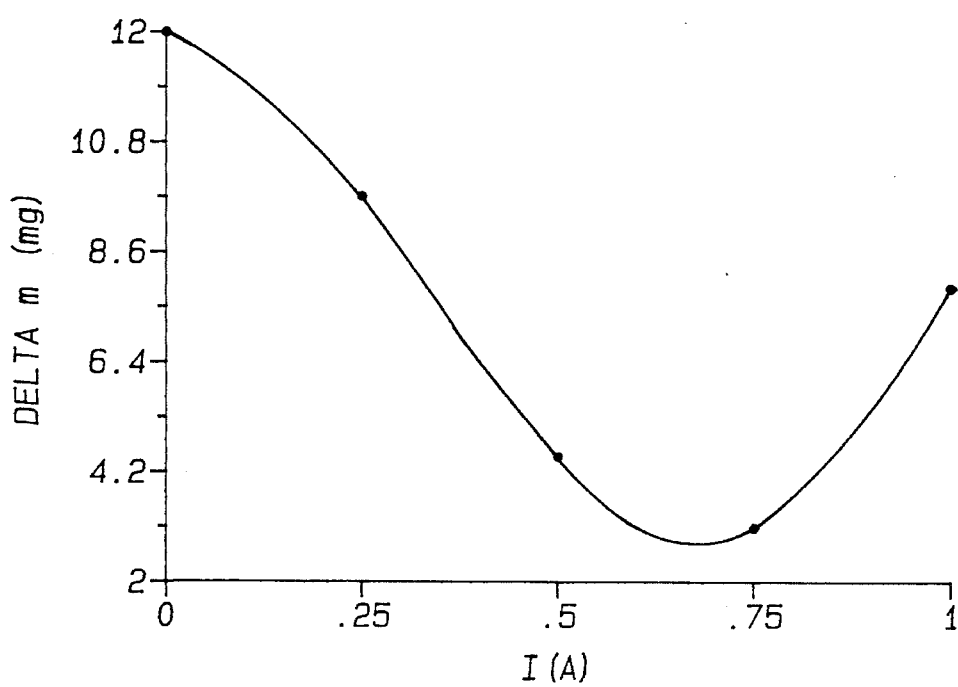
FIG. 9 is a graph illustrating experimental results using varying amperages of auxiliary current on a device illustrated in FIG. 7.
Figure 10:
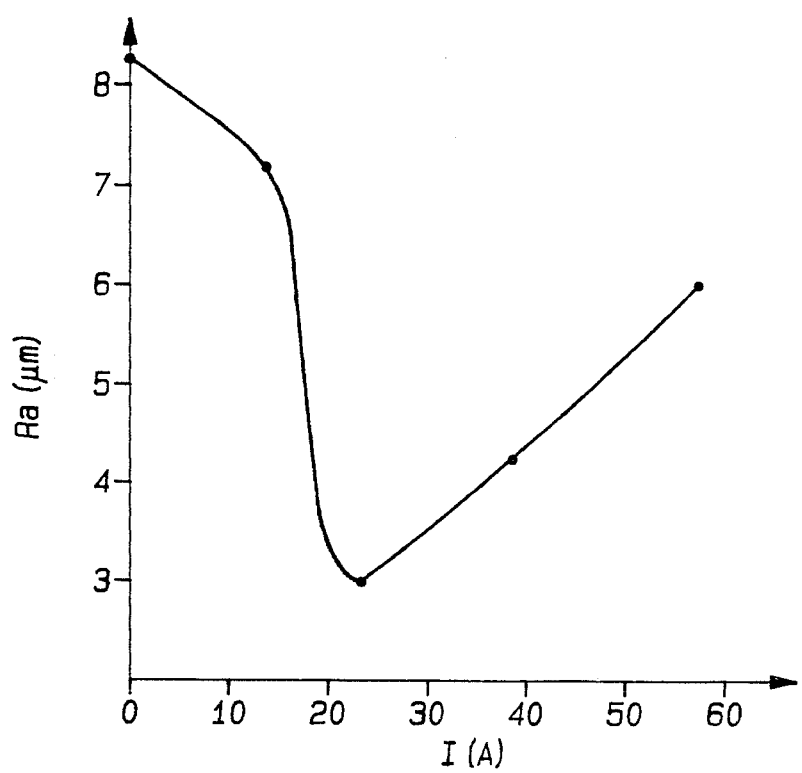
FIG. 10 is a graph illustrating experimental results comparing variances with varying amperage of current.

An optimal value of electrical current exists for optimizing the material or process characteristic desired. Increasing the current beyond said optimal value may give less of a positive effect, or even decreased performance in comparison with a material processed without electrical current. Thus, a preferred method of practicing this invention is to first determine the optimal electrical current for the effect desired, and then adjust the current to that value. Devices using this invention should preferably be equipped with the means of adjusting the electrical current or for providing the predetermined optimal electrical current. This is illustrated in FIGS. 8, 9 and 10. In FIGS. 8 and 9, the desired effect is minimization of erosion in an arc environment. The invention could serve to increase the service life of switch contacts, which are exposed to arcing. In FIG. 8, a 5×8×80 mm specimen served as the cathode of an arc discharge in a 0.1 Torr nitrogen background. The arc was operated repeatedly with 170 A, 1 s duration pulses, while an auxiliary current flowed along the length of the specimen. Applicant noted that the mass loss due to cathodic arc erosion was reduced by a factor of approximately 5.5 when a auxiliary current of approximately 22 A was employed, in comparison with the erosion rate when no auxiliary current was employed. Applicant further noted that deviations from the optimal value of the auxiliary current produced less marked reductions in the erosion rate (e.g., for an auxiliary current of 25 A), or no reduction in the erosion rate (e.g., for auxiliary currents greater than 30 A), or even an increase in the erosion rate (eg for an auxiliary current of 19 A). Applicants thus realized the advantages of performing a preliminary experiment to optimize the value of the electrical current used according to this invention, or providing the means of adjusting the current.

A further example of the minimization of the erosion rate due to arcing is illustrated in FIG. 9. In this case, the specimen was a pair of contacts used in the ignition circuit of automobiles and modified according to the present invention by flowing an auxiliary current along the support structure of one of the contacts. A minimization in the erosion rate is at a particularly auxiliary current. In this case, an auxiliary current of approximately 0.75 A. The invention in this case could be used to extend the lifetime of these contacts and to extend the period of time between adjustment of the contact gap, thus reducing maintenance costs.

An example of using this invention to reduce surface roughness of materials exposed to arcing is illustrated in FIG. 10. Here the surface roughness of the same Cu workpiece described with respect to FIG. 8 above is measured after repeated arcing as a function of the auxiliary current flowing along its length. Yet a further example of optimization is shown in FIG. 10. Here the desired effect is minimization of surface roughness when exposing a 40 mm$^2$ cross section workpiece to 1 s duration, 170 A cathodic arcing in a low pressure (0.1 Torr) N$_2$ gas background. A minimum value of the surface roughness is obtained when an auxiliary current of approximately 22 A is employed.

Variations and modifications are possible without departing from the scope and spirit of the present invention as defined by the appended claims.

We claim:

1. A method of preparing a material in a manner to control its microstructure comprising:

performing at least one of the following material processes: heating said material in an oven to a temperature substantially below the recrystallization temperature of said material, casting liquid material into a mold and subsequent cooling and solidification of said liquid in the mold, deposition of said material on a substrate, electrical arcing, and immersion in a liquid;

simultaneous with at least one material process, passing an electrical current through the material in a direction generally parallel to a surface of said material.

2. A method of preparing material in a manner to control its microstructure as in claim 1 wherein the density of said current is in the range of 0.1–10 A/mm$^2$.

3. A method of preparing material as in claim 1 wherein said material process is deposition onto a substrate and said electrical current is applied to the growing coating of material on said substrate after a continuous conducting material has formed.

4. A method as defined in claim 1 wherein said material process is electrical arcing between two electrodes, wherein said electrical current is introduced in a direction generally perpendicular to the axis of the discharge from the electrical arcing through at least one of the electrodes.

5. A method of preparing material as in claim 3 wherein said substrate is an insulating material, and said electrical current is caused to flow in the coating by positioning electrodes on the substrate such that they make contact with the growing deposition coating, and applying an electrical potential difference between said electrodes.

6. A method of preparing a conductive transparent coating including the following steps:

positioning a substrate into a vacuum chamber having a cathode and an anode;

said cathode comprising a cup-shaped shell of a first metal and a second metal which forms a conductive, transparent oxide;

providing an oxygen containing process gas into the vacuum chamber at a predetermined flow rate:

igniting an arc between said cathode and an anode;

passing arc produced plasma from said cathode through a macroparticle filter and directing it to and depositing it onto the substrate where it forms an oxide coating with said oxygen in said process gas.

7. A method as in claim 6 wherein the said second metal is from the group consisting of tin, indium, or zinc.

8. A method as in claim 6 with the additional step that the substrate is heated during the depositing of the plasma onto the substrate.

9. A method as in claim 6 with the additional step that a directional voltage is applied along the surface of the coating as the plasma is being deposited onto the substrate to provide an electrical current through the deposited coating as it is being deposited on the substrate.

10. A method as in claim 6 further characterized by heating the substrate after deposition of the plasma is completed by thermal annealing.

11. A method of controlling a process parameter during the deposition of conducting coatings comprising the steps of:

mounting a substrate in a holder equipped with at least two electrodes which made contact with a surface of the substrate;

placing a potential difference between at least two of said electrodes;

measuring the current flowing between the two electrodes;

controlling at least one parameter of the deposition process by applying a signal to a control device derived from the measured current.

12. A method as defined in claim 11 further comprising:

taking the derivative of said current flowing between said two electrodes, which will be referred to as the growth rate signal;

establishing an initial parameter value by applying an appropriate non-periodic signal to a device which controls at least one parameter;

applying an additional periodically varying signal to the said parameter control device;

multiplying the said additional periodically varying signal by the growth rate signal, the product of said multiplication being defined as the product signal;

filtering the product signal to reduce or eliminate the periodic variation;

multiplying the filtered product signal by a constant factor to obtain an error signal;

applying said error signal to the signal source to adjust said non-periodic signal.

13. A method as in claim 12 wherein the said controlled parameter is the potential difference between said two electrodes, and said control device is a controlled voltage source supplying said potential difference, and the said growth rate signal is the derivative of said current divided by said potential difference.

\* \* \* \* \*